US011379037B2

(12) United States Patent
Lin et al.

(10) Patent No.: US 11,379,037 B2
(45) Date of Patent: Jul. 5, 2022

(54) SENSOR DEVICE AND METHOD

(71) Applicant: Tangi0 Limited, London (GB)

(72) Inventors: Chia-hung Lin, London (GB); Ilan Johan Eduardo Olivarez Correa, London (GB); Liucheng Guo, London (GB); Ming Kong, London (GB)

(73) Assignee: TANGI0 LIMITED, London (GB)

( * ) Notice: Subject to any disclaimer, the term of this patent is extended or adjusted under 35 U.S.C. 154(b) by 0 days.

(21) Appl. No.: 16/653,534

(22) Filed: Oct. 15, 2019

(65) Prior Publication Data

US 2020/0159319 A1    May 21, 2020

(30) Foreign Application Priority Data

Oct. 15, 2018  (GB) ........................ 1816785

(51) Int. Cl.
*G06F 3/044* (2006.01)
*G06F 3/01* (2006.01)
*H03K 17/96* (2006.01)

(52) U.S. Cl.
CPC .............. *G06F 3/014* (2013.01); *G06F 3/017* (2013.01); *G06F 3/044* (2013.01); *H03K 17/962* (2013.01); *G06F 2203/04103* (2013.01)

(58) Field of Classification Search
None
See application file for complete search history.

(56) References Cited

U.S. PATENT DOCUMENTS 5,510,812 A     4/1996  O'Mara et al.
5,665,212 A *   9/1997  Zhong .................. B29C 70/882
                                                204/280

(Continued)

FOREIGN PATENT DOCUMENTS

DE          19750671        6/1998
JP          2013232291     11/2013
(Continued)

OTHER PUBLICATIONS

Murray-Smith et al., "Stane: Synthesized Surfaces for Tactile Input," Conference: Proceedings of the 2008 Conference on Human Factors in Computing Systems, CHI 2008, Florence, Italy, Apr. 5-10, 2008.

(Continued)

*Primary Examiner* — William C Trapanese
(74) *Attorney, Agent, or Firm* — Barnes & Thornburg LLP; Irina N. Sullivan

(57) ABSTRACT

A sensor device for determining a position of an operator's finger/hand, comprises a handle portion comprising one or more touch sensing electrode portions. Each touch sensing electrode portion is configured to provide an electrical signal in response to the operator's finger/hand being on or near the one or more touch sensing electrode portions. The sensor device also comprises a measurement module configured to receive the or each electrical signal from the touch sensing electrode portion(s) and determine a position of the operator's finger/hand relative to one or more of the touch sensing electrode portions based on the or each electrical signal. The or each touch sensing electrode portion is formed of or comprises a non-metallic conductive material.

19 Claims, 7 Drawing Sheets

(56) References Cited

U.S. PATENT DOCUMENTS

| | | | |
|---|---|---|---|
| 6,373,265 B1 | 4/2002 | Morimoto et al. | |
| 8,077,154 B2 | 12/2011 | Emig et al. | |
| 8,803,844 B1 | 8/2014 | Green et al. | |
| 8,994,648 B2 | 3/2015 | Lamb | |
| 9,801,273 B2 | 10/2017 | Keranen et al. | |
| 2003/0222660 A1 | 12/2003 | Morimoto | |
| 2006/0282873 A1 | 12/2006 | Zalewski et al. | |
| 2009/0303022 A1 | 12/2009 | Griffin et al. | |
| 2010/0225340 A1 | 9/2010 | Smith et al. | |
| 2011/0234502 A1 | 9/2011 | Yun et al. | |
| 2013/0021278 A1 | 1/2013 | Landau et al. | |
| 2013/0021287 A1 | 1/2013 | Endo et al. | |
| 2013/0154996 A1* | 6/2013 | Trend | G06F 3/0446 345/174 |
| 2013/0162582 A1 | 6/2013 | Hatano et al. | |
| 2013/0162596 A1 | 6/2013 | Kono et al. | |
| 2013/0275082 A1 | 10/2013 | Follmer et al. | |
| 2014/0036428 A1* | 2/2014 | Leong | H03K 17/9622 361/679.01 |
| 2014/0320431 A1 | 10/2014 | Cruz-Hernandez et al. | |
| 2015/0227217 A1 | 8/2015 | Fukumoto | |
| 2016/0124510 A1 | 5/2016 | Hyde et al. | |
| 2016/0209920 A1 | 7/2016 | Mastandrea | |
| 2016/0275333 A1 | 9/2016 | Lin | |
| 2017/0031503 A1* | 2/2017 | Rosenberg | G06F 3/04815 |
| 2017/0102775 A1 | 4/2017 | Keller et al. | |
| 2017/0189798 A1 | 7/2017 | Rogoza et al. | |
| 2017/0371490 A1 | 12/2017 | Sugimoto et al. | |
| 2018/0067545 A1* | 3/2018 | Provancher | G06F 3/044 |
| 2018/0077976 A1 | 3/2018 | Keller et al. | |
| 2018/0099219 A1 | 4/2018 | Hope et al. | |
| 2018/0264357 A1 | 9/2018 | Dalton et al. | |
| 2018/0267667 A1 | 9/2018 | De Araujo et al. | |

FOREIGN PATENT DOCUMENTS

| | | |
|---|---|---|
| TW | 201506749 | 2/2015 |
| WO | WO 2016/140924 | 9/2016 |
| WO | WO 2017/067387 | 10/2016 |
| WO | WO 2016/206819 | 12/2016 |
| WO | WO 2017/030497 | 2/2017 |
| WO | WO 2017/150127 | 9/2017 |

OTHER PUBLICATIONS

Sato et al., "Nonimmersive Virtual Reality Mirror Visual Feedback Therapy and Its Application for the Treatment of Complex Regional Pain Syndrome: An Open-Label Pilot Study," 2010, Pain Medicine, 11(4): 622-629 (Apr. 2010).
Smith et al., "Tech Note: Digital Foam," IEEE Symposium on 3D User Interfaces (Mar. 8-9, 2008).
"Valve's Knuckles EV2 controller will let you squeeze objects in games," accessed on-line at: https://www.cnet.com/news/valves-new-knuckles-vr-controller-knows-where-your-fingers-are/ (Jun. 22, 2018).
Partial Search Report issued in EP Application No. 19201217 (dated 2020).
Search Report issued in United Kingdom Appl. No. 1914894.9 (dated 2020).
Extended Search Report issued in EP Application No. 19201217 (dated 2020).

* cited by examiner

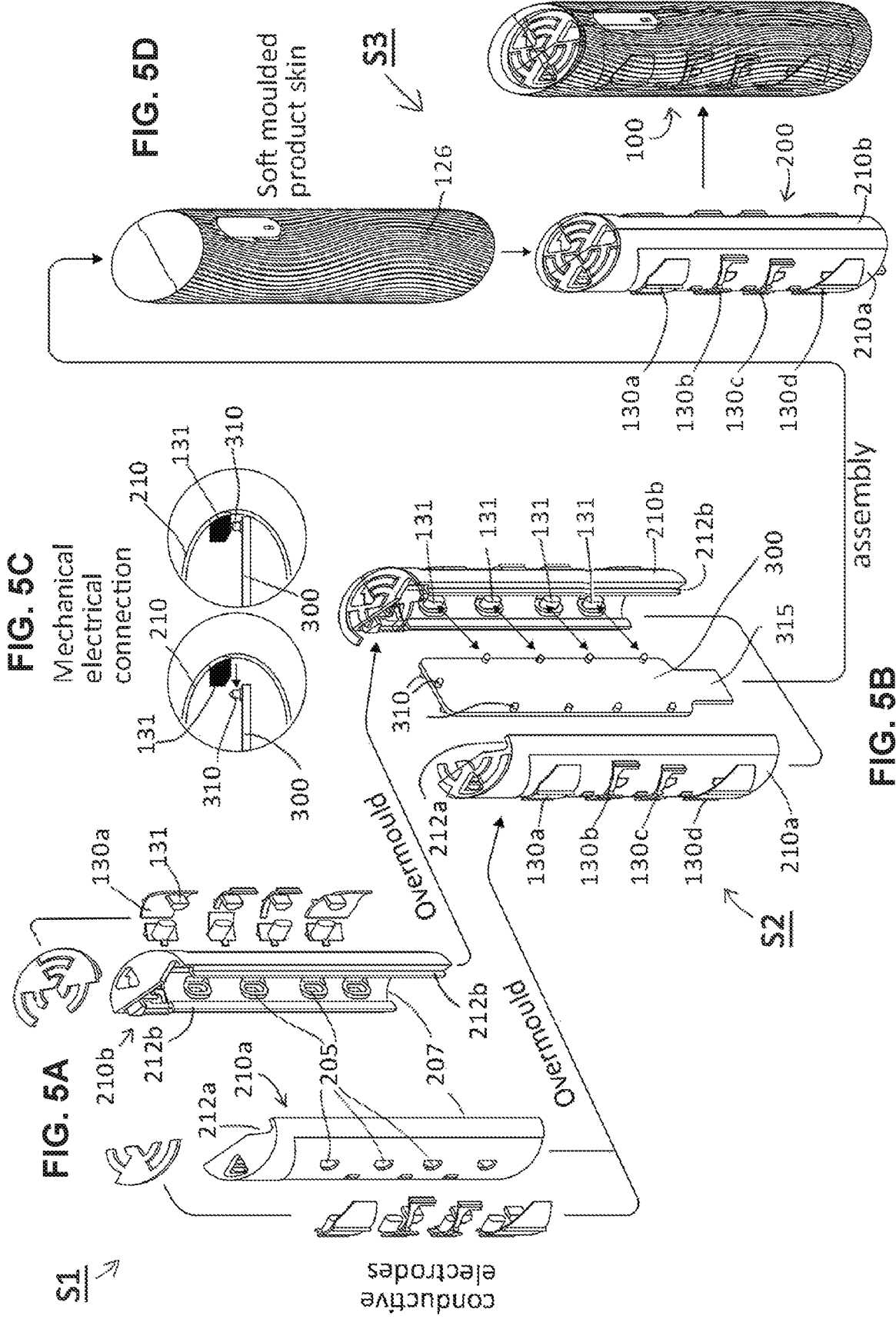

SENSOR DEVICE AND METHOD

CROSS REFERENCE TO RELATED APPLICATIONS

This application claims priority to United Kingdom Application No. 1816785.8, filed on Oct. 15, 2018. The disclosure set forth in the referenced application is incorporated herein by reference in its entirety.

TECHNICAL FIELD

This invention relates generally to a sensor device for determining a position of an operator's finger/hand and, particularly, but not exclusively, to a handheld or hand-mountable sensor device. The invention also relates to a method of manufacturing a sensor device.

BACKGROUND TO THE INVENTION

Handheld remote controllers have traditionally translated human hand and/or finger movement into input/command signals through the mechanical movement of switches, buttons and joysticks. The commands are delivered from the user to a computer processor, and finally to a device to provide a visual and/or sound output such as switching TV channels or tuning the volume of a speaker. Increasingly intricate and immersive digital technologies and software environments (e.g., virtual reality environments) have created an increasing demand for advanced sensing and control technologies that can understand nuanced human hand and finger movement (e.g., gestures) in order to achieve natural and intuitive human-machine interactions. This has created a trend of moving away from traditional controller typologies such as buttons, scrolls and joysticks.

Capacitive touch sensing is a technology now commonly employed in consumer electronic controller devices. Based on the principle of capacitive coupling, capacitive sensors produce a signal change that reflects the contact (touch), location, coverage area and/or displacement of a conductive object (e.g., a human finger). Commonly used capacitive touch sensors comprise printed metallic materials on thin substrates that form a network or grid of sensing electrodes. The printed electrode pattern can be customised to meet different requirements of the device and outer isolation material configurations (see e.g., U.S. Pat. No. 8,077,154B2). However, the need for high fidelity gestural controllers has posed challenges to traditional capacitive sensing manufacturing methods. For example, a capacitive sensor requires a non-conductive isolation layer between the sensor electrode and the human finger(s) to provide protection, set up a capacitance and limit noise. Traditionally, the isolation layer is often required to be rigid and uniform in thickness. This means any touch sensing surface constructed with a 3D (three dimensional) profile needs the underlying substrate and printed electrodes to conform to the 3D profile. Flexible printed circuitry can meet this need by bending portions of the substrate to attach to the back side of the outer isolation layer. However, such bending is limited to be in one direction only due to the nature of the flexible substrate materials (e.g., PET plastics). Technologies such as vacuum formed printed electronics (e.g., U.S. Pat. No. 9,801,273B2) can form 3D profiled substrates onto which printed metallic electrodes are applied before or after forming, but such vacuum formed substrates are limited by the 3D profiles' depth due to the limited flexibility of the electrode materials used.

Aside from applications in mere control, controller technologies that can determine human hand and finger movements may have applications in sign language translation and in the medical field, such as in mirror therapy.

Mirror therapy traditionally uses a mirror to create an illusion, tricking the brain into believing that a part of the body currently affected by motor issues is no longer affected. However, there has been promising research that demonstrates the potential for mirror therapy in non-immersive virtual reality (e.g., Non-immersive Virtual Reality Mirror Visual Feedback Therapy and Its Application for the Treatment of Complex Regional Pain Syndrome: An Open-Label Pilot Study, 2010). As such, controllers capable of projecting finger movement into a virtual environment would enable mirror therapy to become more immersive and interactive. People with motor difficulties under recovery would also be able to wear a device and it would be able to gather more useful data regarding the movement capability and squeezing capability of patients.

Currently, sign language translation to non-sign language users requires a camera and a computer system. The camera must be pointed at the 'signer' to understand their gestures and movements, limiting the range of hand/arm movement to the field of view to the camera. A gestural sensing handheld controller would enable free gesture and movement to the 'signer' and completely circumvent the necessity of a camera-based device to enable detection and translation.

With the mentioned problems and market needs, US2017/0102775A1 and US2018/0077976 show hand-worn controllers in the form of wearable gloves which translate movement of hands and fingers into input signals based on the deformation of the gloves. These controllers can offer high level gestural control functions through the use of force sensors and bend sensors to detect finite movement of hands and fingers.

There are numerous challenges and limitations of the above mentioned controllers. While they offer additional sensing capabilities compared to conventional handheld controllers (e.g., see US2006/0282873A1), they are costly to manufacture and heavy. Mass production costs are highly sensitive to the materials/components used, number of parts to be assembled and complexity of the products. Known controllers employ rigid plastic housings and a large number of conventional and typically heavy electronic components (e.g., capacitive sensors, tracks, circuit boards etc.) made from relatively costly metallic/semiconducting materials. As such, the component costs are high and the production process can be assembly-intensive, particularly with the use of flexible printed electronics. Modulation of control functions also adds weight as each moving part requires an individually injection-moulded plastic part. In addition, a good fit between a glove controller and the user's hand is crucial for its sensing functions, and thus performance can be sub-optimal depending on the fit. With heavy/rigid conventional electronic components embedded in each sensor glove, it is impractical to mass produce gloves for all kinds of hands sizes and proportions. This type of controller may also be cumbersome when users complete daily actions like to typing, grabbing or holding other objects.

Aspects and embodiments of the present invention have been devised with the foregoing in mind.

SUMMARY OF THE INVENTION

According to a first aspect of the invention, there is provided a sensor device for determining a position of an operator's finger and/or hand. The device may comprise a handle portion. The handle portion may be mountable to or holdable in a said operator's hand for gripping by one or more fingers of said hand. The handle portion may comprise one or more touch sensing electrode portions. The or each touch sensing electrode portion may be configured to provide an electrical signal in response to the operator's finger/hand being on or near the one or more touch sensing electrode portions. The device may further comprise a measurement module. The measurement module may be receivable or mountable within the handle portion. The measurement module may be configured to receive the or each electrical signal from the touch sensing electrode portion(s) and determine a position of the operator's finger/hand relative to one or more of the touch sensing electrode portions based on the or each electrical signal. The or each touch sensing electrode portion may be formed of or comprise a non-metallic conductive material.

The term non-metallic conductive material used here and throughout means a material that is not a metal (e.g., gold, silver or aluminium).

The or each touch sensing electrode portion may be formed of or comprise a thermo-formable material and/or may be formed by a moulding process. The touch sensing electrode portion(s) may be substantially rigid, pliable and/or deformable. A suitable material for the touch sensing electrode portion(s) may include but is not limited to a conductive plastics, such as conductive acrylonitrile butadiene styrene (ABS) or conductive polyurethane (PU), conductive ethylene vinyl acetate (EVA). Such materials may undergo an injection-moulding/heat-pressing or thermo-forming process.

The use of mouldable non-metallic conductive materials for the touch sensing electrode portion(s) has a number of advantages over conventional sensing technologies using metal electrodes. The material cost and weight is significantly lower than that of conventional metal electrode materials (such as a gold, silver or aluminium). Manufacture/assembly of the sensor device is simplified and the associated manufacture/assembly cost is reduced. In addition, the touch sensing electrode portion(s) can be formed and/or moulded into almost any arbitrary size, shape or three-dimensional (3D) form due to the nature of the moulding process. This has a number of practical and functional advantages:

- The touch sensing electrode portion(s) may conform to the exterior shape of the handle portion regardless of the complexity of the exterior shape. This eliminates the need for flexible printed circuits which can introduce complexity in the electrode arrangement, wiring, and increase wear and tear and assembly costs.
- The touch sensing electrode portion(s) has(have) 3D volumes and can cover larger areas enabling them to be much more sensitive to capacitance changes and produce larger signal changes compared to the typically smaller metal electrode counterparts.
- The size and shape of the or each touch sensing electrode portion can be chosen to tailor, e.g., to produce smooth electrical signal changes between a minimum and maximum signal values. This allows the touch sensing electrode portion(s) to sense a wider range of finger/hand movements.
- Overall, the design freedom for the touch sensing electrode portion(s), the electrode arrangement and the sensor device itself are significantly increased.

In addition, e.g., through machine learning software methods, the large 3D touch sensing electrode portion(s) can enable the measurement of not only the distance ("vertical") proximity of a finger/thumb/hand section, but also position—"horizontal finger position—and distribution providing detection of complex and realistic gestures.

The or each touch sensing electrode portion may form at least a part of one or more electrodes. For example, each touch sensing electrode portion may be or form a separate touch sensing electrode, or two or more touch sensing electrode portions may be physically and/or electrically connected to form a single electrode (e.g., from a unitary piece of non-metallic conductive material). The device may comprise one or more separate touch sensing electrodes.

Each touch sensing electrode or electrode portion may connected to the measurement module at one or more sensing points. Each sensing point may provide a separate electrical signal to the measurement module in response to the operator's finger/hand being on or near the respective sensing point.

The device may comprise a plurality of touch sensing electrode portions spatially distributed around the handle portion. Each touch sensing electrode portion may be configured to provide an electrical signal in response to touch by an operator, such as touch by different portions of a digit or different digits (or finger portions). The electrode portions may be distributed in a pattern or sets corresponding to expected digit positions. The portion of the digit/finger may be or comprise a proximal, intermediate or distal phalange of the digit/finger.

The or each touch sensing electrode or electrode portion may be configured as a capacitive touch sensor. The or each electrical signal may be provided in response to a change in capacitance between the respective touch sensing electrode portion and the operator's finger/hand. The position or vicinity of touch and/or movement can therefore be determined and may be represented as a 'heat map' over the handle portion indicating both the contact/touch areas as well as pressure of the fingers.

The measurement module may comprise one or more electrical connectors configured to mechanically contact the or each touch sensing electrode portion (e.g., at a sensing point). The term mechanical contact means physically in contact to provide an electrical connection between the electrical connector and the touch sensing electrode portion that is non-permanent, i.e., not a solder joint or other form of wire bonding.

Advantageously, the measurement module is directly connectable to the touch sensing electrode portion(s) (e.g., during device assembly) eliminating the need for wires, printed conductive traces or soldering.

The or each connector may be or comprise a substantially rigid mating portion configured to deform or penetrate a contacting portion (e.g., at the sensing point) of the or each touch sensing electrode portion. The mating portion may be or comprise one or more metal projections, pins, a castellated pad, clip pins, or any other form of metal connector that allows a secure mechanical connection to the touch sensing electrode portion.

Optionally or preferably, the mating portion may be biased towards the contacting portion of the or each touch sensing electrode portion, or vice versa. For example, the mating portion may be spring loaded. Additionally or alternatively, the non-metallic conductive material of the touch sensing electrode portion may be substantially resilient and apply a reaction force bearing against the mating portion in response to deformation (compression or bending) by the mating portion.

The or each touch sensing electrode portion may be dimensioned for sensing touch by an operator's digit (e.g., finger or thumb). Optionally or preferably, the or each touch sensing electrode may have a dimension substantially the width of a finger. The dimension of the touch sensing electrode may be a width or length. The width or length may be substantially equal to the width of a typical finger, or substantially less than or substantially greater than the width of a typical finger. For example, the width or length of a touch sensing electrode portion may be in the range 5 mm to 15 mm. Each touch sensing electrode portion may have the same width and/or length, or a different length and/or width.

The handle portion may be or comprise a first non-conductive material at least provided on or over each touch sensing electrode portion. The first non-conductive material may form at least a part of an exterior surface of the handle portion.

The handle portion may comprise a core. The or each touch sensing electrode portion may be formed in or on the core. The touch sensing electrode portion(s) may be at least partially embedded in the core. The first non-conductive material may be further provided on or over the core. The core may be formed of or comprise a second non-conductive material. The first non-conductive material may be the same or different to the second non-conductive material.

The core may be substantially hollow or at least partially hollow and the measurement module may be mountable or receivable within the core. The contacting portion of the or each touch sensing electrode portion may be formed over, in, and/or extend through an opening in a wall of the core to permit contacting by the one or more connectors of the measurement module. The electrical connector(s) may be configured to mechanically contact the contacting portion of the touch sensing electrode portion upon mounting the measurement module with the handle portion.

The first non-conductive material may be configured to provide a hand and/or finger grip. Optionally or preferably, the first non-conductive material may have a three dimensionally profiled exterior surface. For example, the exterior surface may be or comprise a textured surface. For example, the exterior surface may comprise one or more ridges, undulations an/d or contours etc. The first non-conductive material may be configured as an outer skin of the device which the operator touches. The outer skin may be provided on or over the core and touch sensing electrode portions. The outer skin may be the exterior surface of the handle portion.

The first non-conductive material and/or the second non-conductive material may be formed of or comprise a thermoformable material. Optionally or preferably, the first and/or second non-conductive material is formed by a moulding process.

The or each touch sensing electrode portion may be formed in or on the core by a moulding process, such as an over-moulding process.

Suitable materials for the first non-conductive material and/or the second non-conductive material include but are not limited to non-conductive plastics, such as non-conductive polyurethane (PU), ABS, polycarbonate (PC), thermoplastic elastomer and silicone rubber.

The first non-conductive material and/or the second non-conductive material may be substantially rigid, pliable and/or deformable. In one embodiment, the core is substantially rigid to support the sensor electrodes portions, the first non-conductive material, and/or the overall shape/structure of the handle portion.

Alternatively or additionally, the core may be integral with the first non-conductive material. The or each touch sensing electrode portion may be formed or defined in or on the interior surface of the first non-conductive material. The touch sensing electrode portion(s) may be at least partially embedded in the interior surface of the first non-conductive material. In this case, the first non-conductive material may be substantially rigid and support the sensor electrodes portions and/or the overall shape/structure of the handle portion, such that a separate core is not required. The or each touch sensing electrode portion may be formed or defined in or on the interior surface of the first non-conductive material by a moulding process, such as an over-moulding process.

The or each sensing electrode portion may have a sensing surface configured, for example formed with a three dimensional profile, to conform to the exterior surface of the first non-conductive material. In this way, the separation between the sensing surface of the or each sensing electrode portion and the exterior surface of the first non-conductive material may be substantially uniform. Alternatively or additionally, the sensing surface of the or each sensing electrode portion may conform to the interior surface of the first non-conductive material. Alternatively, the sensing surface of the or each sensing electrode portion may not conform to the exterior surface of the first non-conductive material.

The device may further comprise a switching mechanism configured to provide a control signal to the measurement module to switch the measurement module between a left hand mode and a right hand mode. The switching mechanism may be disposed on or in the handle portion. The switching mechanism may be a switch, button or sensor.

The measurement module may be configured to determine a position of a left hand finger based on the or each electrical signal and the control signal when in the left hand mode. The measurement module may be configured to determine a position of a right hand finger based on the or each electrical signal and the control signal when in the right hand mode.

The device may optionally further comprise a hand mounting portion. The hand mounting portion may be connected or connectable to the handle portion and be configured to mount the handle portion to a said operator's hand or finger(s).

The hand mounting portion may be a left hand mounting portion configured to mount the handle portion to a left hand, or a right hand mounting portion configured to mount the handle portion to a right hand. Either mounting portion may be configured to fit to the same handle portion.

The switching mechanism may be manually actuated. Alternatively, the switching mechanism may be actuated upon connection of the hand mounting portion to the handle portion. The switching mechanism may be incorporated in or part of the coupling between the hand mounting portion and the handle portion.

The measurement module may also comprise other electronics, e.g., needed to support motion tracking and acceleration of the user's hand. Acceleration sensor technologies may be implemented on top of the measurement module mounted within the handle portion. Such tracking technologies can be implemented through active sensors, e.g., included on or in the mounting portion. Examples of active sensor tracking technologies include: laser tracking that uses light sensors in the device to detect light emitted by remote laser emitters; using markers on the device and a remote camera to track their position, or electromagnetic tracking using an emitter/receiver on the device and a remote receiver/emitter to track the relative positions of the emitter and receiver. The device may also use passive tracking systems such as object tracking through a camera with machine learning.

According to a second aspect of the invention, there is provided a method of manufacturing a sensor device. The method may comprise forming a handle portion comprising one or more touch sensing electrode portion(s) formed from a non-metallic conductive material. The method may further comprise providing a measurement module configured to receive an electrical signal from the or each touch sensing electrode portion, and mounting the measurement module within the handle portion.

Advantageously, the measurement module is directly connectable to the touch sensing electrode portion(s) eliminating the need for wires, printed conductive traces or soldering. Furthermore, the use of moulded components and mechanical interconnections greatly simplifies the manufacture and assembly of the device. This, together with the relatively inexpensive mouldable non-metallic materials, means the cost of manufacturing the device is also substantially less than sensor devices based on conventional materials and sensing technologies (e.g., using metal electrodes, wires and/or flexible circuits). Due to the mouldable materials used to the form the touch sensing electrode portion(s) the device is substantially lightweight compared to devices using conventional sensor technologies and metal electrode materials.

The touch sensing electrode portion(s) can be formed and/or moulded into almost any arbitrary size, shape or three-dimensional (3D) form due to the nature of the moulding process. The 3D profile of the touch sensing electrode portion(s) is completely customisable with the design of the mould tooling sets, which means that it can be optimised for an ergonomic fit to fingers and hands, and can have structures easily connected or connectable to the measurement module. It also saves weight and space for the overall device.

The step of forming the handle portion may comprise forming the one or more touch sensing electrode portion(s).

Forming the handle portion may further comprise forming and/or providing a first non-conductive material at least on or over the or each touch sensing electrode portion.

The first non-conductive material may be shaped and/or configured to provide a hand and/or finger grip. Optionally or preferably, the first non-conductive material may have a three dimensionally profiled exterior surface. For example, the exterior surface may be or comprise a textured surface. For example, the exterior surface may comprise one or more ridges, undulations or contours etc.

The or each sensing electrode portion may be formed with a sensing surface shaped and/or configured, for example formed with a three dimensional profile, to conform to the exterior surface of the first non-conductive material. Alternatively or additionally, the sensing surface of the or each sensing electrode portion may conform to the interior surface of the first non-conductive material. Alternatively, the sensing surface of the or each sensing electrode portion may not conform to the exterior surface of the first non-conductive material.

Forming the handle portion may further comprise forming a core, and forming the or each touch sensing electrode portion in or on the core. The touch sensing electrode portion(s) may be at least partially embedded in the core. Forming the core may comprise forming the core in one or more parts or shell or housing portions and joining the parts together. The core may be substantially hollow or at least partially hollow and the measurement module may be mountable within the core.

Forming the handle portion may further comprise further providing and/or forming the first non-conductive material on or over the exterior surface of the core. For example, the first non-conductive material may be formed or provided on or over the core and the or each touch sensing electrode portion may be formed in/on the core.

The core may be formed of or comprise a second non-conductive material. The first non-conductive material may be the same or different to the second non-conductive material.

Alternatively, the first non-conductive material may be or comprise the core, and the or each touch sensing electrode portion may be formed in or on the interior surface of the first non-conductive material. In other words, the core may be integrally formed with the first non-conductive material.

The touch sensing electrode portion(s), the first non-conductive material, and/or the second non-conductive material may be formed of or comprises a thermo-formable material. The touch sensing electrode portion(s), the first non-conductive material, and/or the second non-conductive material may be is formed by a moulding process.

The touch sensing electrode portion(s), the first non-conductive material, and/or the second non-conductive material may be formed by an over-moulding process. Alternatively, the touch sensing electrode portion(s), the first non-conductive material, and/or the second non-conductive material may be formed or moulded separately and assembled together.

The step of mounting the measurement module within the handle portion may comprise positioning the measurement module to a contacting position within the handle portion in which the one or more electrical connectors of the measurement module mechanically contact the touch sensing electrode portion(s).

Positioning the measurement module may comprise moving or inserting the measurement module into the handle portion or the hollow core to secure the measurement module in the contacting position in which the one or more connectors contact the plurality of finger sensing electrodes.

Alternatively, where the core is formed in more than one part, positioning the measurement module may comprise joining the core parts around the measurement module, e.g., to secure the measurement module in the contacting position in which the one or more connectors contact the plurality of finger sensing electrodes.

The moulding process may be or comprise injection moulding, thermo-forming, heat-press, and/or over-moulding.

The touch sensing electrode portion(s) may be substantially rigid, pliable and/or deformable. Suitable materials for the touch sensing electrode portion(s) may include but are not limited to conductive plastics, such as conductive acrylonitrile butadiene styrene (ABS) or conductive polyurethane (PU), conductive ethylene vinyl acetate (EVA). Such materials may undergo an injection-moulding/heat-pressing or thermo-forming process.

Suitable materials for the first non-conductive material and/or the second non-conductive material include but are not limited to non-conductive plastics, such as non-conductive polyurethane (PU), ABS, polycarbonate (PC), thermoplastic elastomer and silicone rubber.

The first non-conductive material and/or the second non-conductive material may be substantially rigid, pliable and/or deformable. In one embodiment, the core is substantially rigid to support the touch sensor electrodes portions, the first non-conductive material, and/or the overall shape/structure of the handle portion.

The first non-conductive material may be an outer skin or layer of the sensor device. Alternatively, a separate outer skin may be formed and/or provided over the first non-conductive material and/or the core.

According to a third aspect of the invention, there is provided a method of manufacturing the sensor device of the first aspect. The method of the third aspect may include any or all of the steps of the second aspect.

The method may comprise forming a handle portion comprising one or more touch sensing electrode portion(s) formed from a non-metallic conductive material. Each touch sensing electrode portion may be configured to provide an electrical signal in response to the operator's finger/hand being on or near the one or more touch sensing electrode portions. The method may further comprise providing a measurement module configured to receive the or each electrical signal from the touch sensing electrode portion(s) and determine a position of the operator's finger/hand relative to one or more of the touch sensing electrode portions based on the or each electrical signal. The method may further comprise mounting the measurement module within the handle portion.

Forming the handle portion may further comprise forming a hollow core and forming the plurality of finger sensing electrodes in or on the core. The core may be formed from or comprise a non-conductive and optionally thermo-formable material. The core may be a unitary part. Alternatively, forming the hollow core may comprise forming a first shell portion and forming a second shell portion. The method may comprise forming one or more of the touch sensing electrode portions in or on each of the first and second shell portions. The method may further comprise joining the first and second shell portions together to form a cavity within the core.

Forming the touch sensing electrode portion(s) and/or the hollow core may comprise moulding using a moulding process.

The method may further comprise the step of forming and/or providing a first non-conductive material on or over the touch sensing electrode portion(s), and optionally or preferably at least a portion of the exterior surface of the core.

The first non-conductive material may be an outer skin or layer of the sensor device. Alternatively, a separate outer skin may be formed and/or provided over the first non-conductive material and/or the core.

Aspects and embodiments of the present invention provide advantages over and solutions to the mentioned limitations of existing controllers by providing an ergonomic, lightweight and inexpensive, e.g., handheld controller device configured to detect finger and/or hand position and/or gestures and a method of manufacturing the same. The device is suitable for use in numerous applications such as mirror therapy, sign language detection and video gaming.

Features which are described in the context of separate aspects and embodiments of the invention may be used together and/or be interchangeable. For example, the features or embodiments of the first, second and/or third aspects may be used together in whole or in part and/or may be interchangeable. The method steps may be performed in different orders. Features described in connection with the sensor device may have corresponding features definable with respect to the method(s) and these embodiments are specifically envisaged. Similarly, where features are, for brevity, described in the context of a single embodiment, these may also be provided separately or in any suitable sub-combination.

BRIEF DESCRIPTION OF DRAWINGS

In order that the invention can be well understood, embodiments will now be discussed by way of example only with reference to the accompanying drawings, in which:

FIGS. 5A-5D illustrate steps of a method of assembling the device of FIGS. 1 to 4 according to an embodiment of the invention;

Figure 1A:
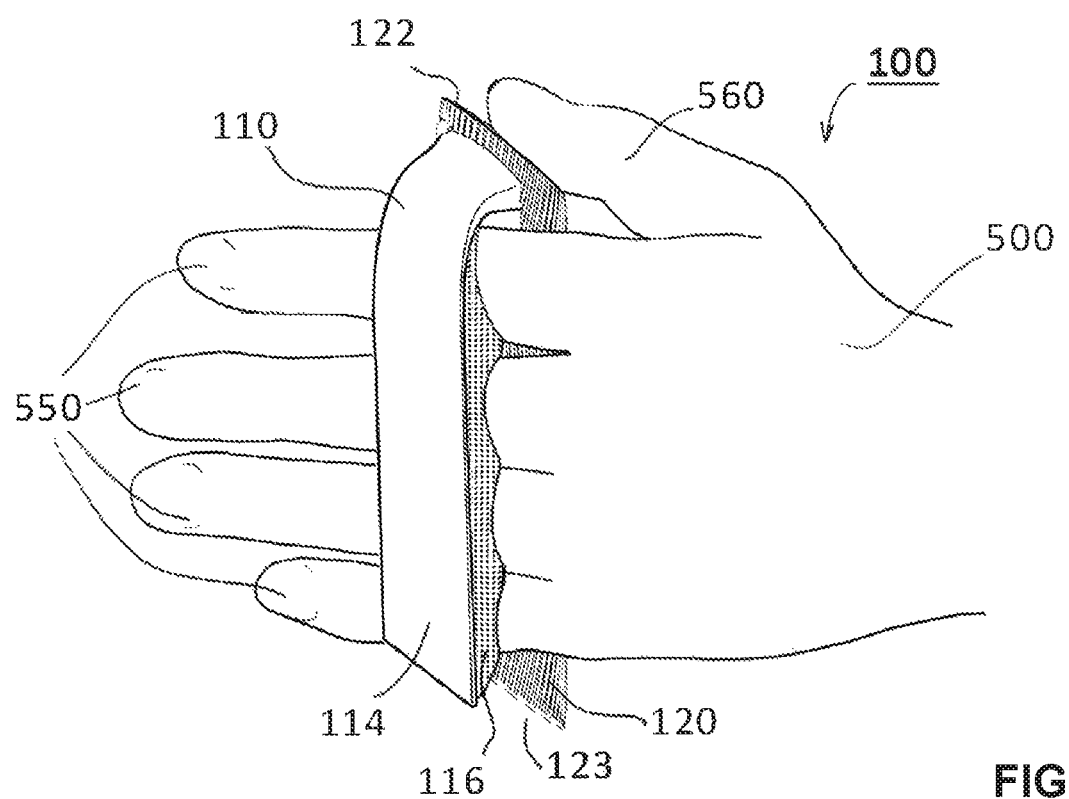
FIGS. 1A and 1B show illustrations of a sensor device according an embodiment of the invention, mounted to a left hand.

It should be noted that the figures are diagrammatic and may not be drawn to scale. Relative dimensions and proportions of parts of these figures may have been shown exaggerated or reduced in size, for the sake of clarity and convenience in the drawings. The same reference signs are generally used to refer to corresponding or similar features in modified and/or different embodiments.

DETAILED DESCRIPTION

Figure 1B:
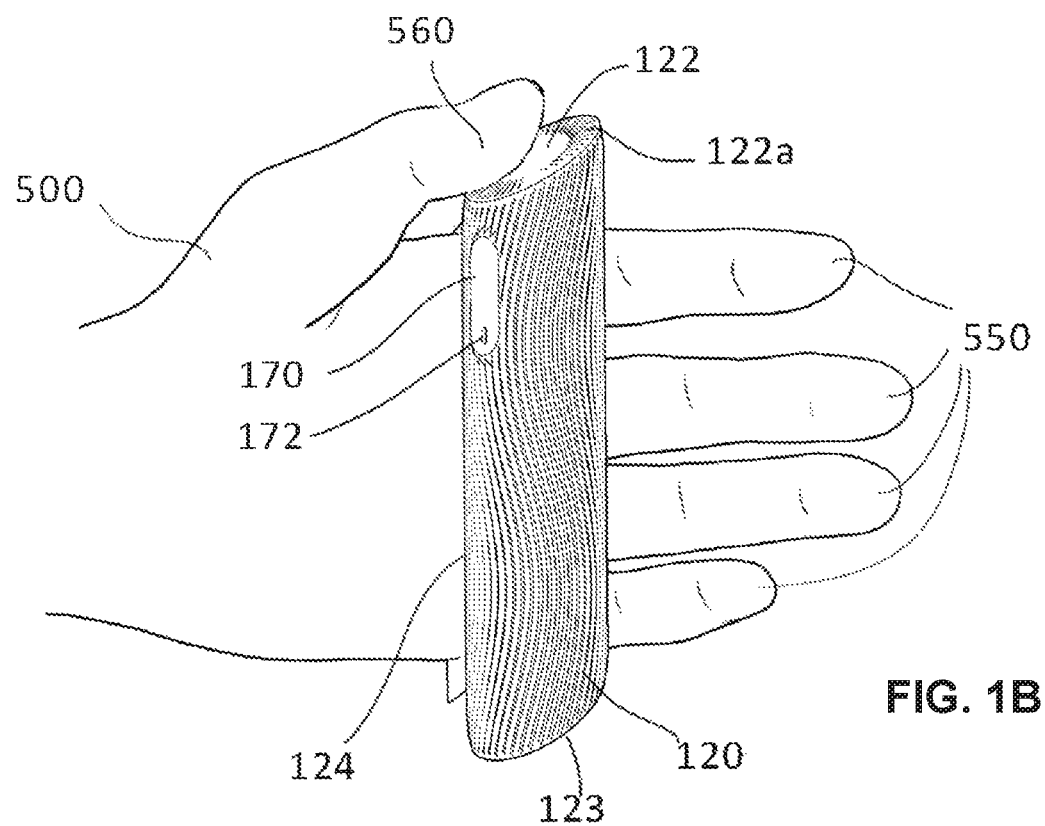

FIGS. 1A and 1B show an embodiment of a sensor device 100 for determining a position or pose of an operator's finger(s) 550 and/or hand 500. The device 100 is a hand-mountable or hand-held device. The device 100 comprises a handle portion 120 comprising electronic components for determining finger 550/hand 500 positions and a hand mounting portion 110 connectable to the handle portion 120 for mounting the handle portion 120 to or against a user's hand 500, as shown.

The mounting portion 110 is shown in the form of a semi-open clip structure. The mounting portion 110 comprises one end that is attachable to the handle portion 120 at a coupling 112a and another end that extends (when connected to the handle portion 120) from the handle portion 120 around to the back of the hand 500 or fingers 550 to hold or retain the handle portion 120 against the inside of the hand 500 or fingers 550. However, it will be appreciated that the mounting portion 110 may take other forms. For example, alternatively the mounting portion 110 may be coupled to the handle portion 120 at two points to form a closed loop or opening that extends completely around the hand 500 or fingers 550.

The function of the mounting portion 110 is to hold or retain the handle portion 120 in an operating position against the inside of the hand 500 or fingers 550 without the need for the user to physically grip/hold the handle portion 120. This is illustrated in FIGS. 1A and 1B which shows the device 100 mounted to the operator's hand 500 with the hand 500 and/or fingers 550 in an opening pose/position. The operating position is preferably one where the device 100 is mounted between the first and second knuckles (between the metacarpophalangeal (MCP) joint and the proximal interphalangeal (PIP) joint) of the fingers 550 or on the proximal phalanges, as shown in FIGS. 1A and 1B.

The hand mountable function has several benefits: (i) It enables the device 100 to sense a full range of positions of a user's finger(s) 550 relative to the handle portion 120 between the opening position (as shown in FIGS. 1A and 1B) and the closed position (i.e., fully gripping the handle portion (not shown)); (ii) it helps to maintain the handle portion 120 in the operation position during movement of the finger(s) 550; and (iii) it allows the user to be fully free to move and use their finger(s) 550 to hold and/or pick up other objects, and also complete simple actions/tasks such as typing or the like.

The mounting portion 110 comprises a core structure 114 to support the handle portion 120. The core structure 114 is formed from a substantially tough and flexible material (e.g., acrylonitrile butadiene styrene (ABS)). Optionally, the mounting portion 110 may further comprise a padded or cushioned portion 116, as shown in FIG. 1A. The padded portion 116 is substantially deformable and arranged, in use, to fill any excess space between the back of the user's hand 500 or finger's 550 and the core structure 114. This may allow the device 100 to fit fingers of different thickness. The padded portion 116 may further be substantially resilient to bias the handle portion 120 towards the user's hand 500 or fingers 550. For example, the padded portion 116 may be formed of or comprise a foam (such as a memory foam or any other high density foam), soft rubber (e.g., neoprene), soft plastic (e.g., thermoplastic elastomer), or ethylene-vinyl acetate (EVA), silicone rubber. The padded portion 116 may further be laminated and/or covered with a fabric material, such as synthetic leather or the like.

Figure 2:
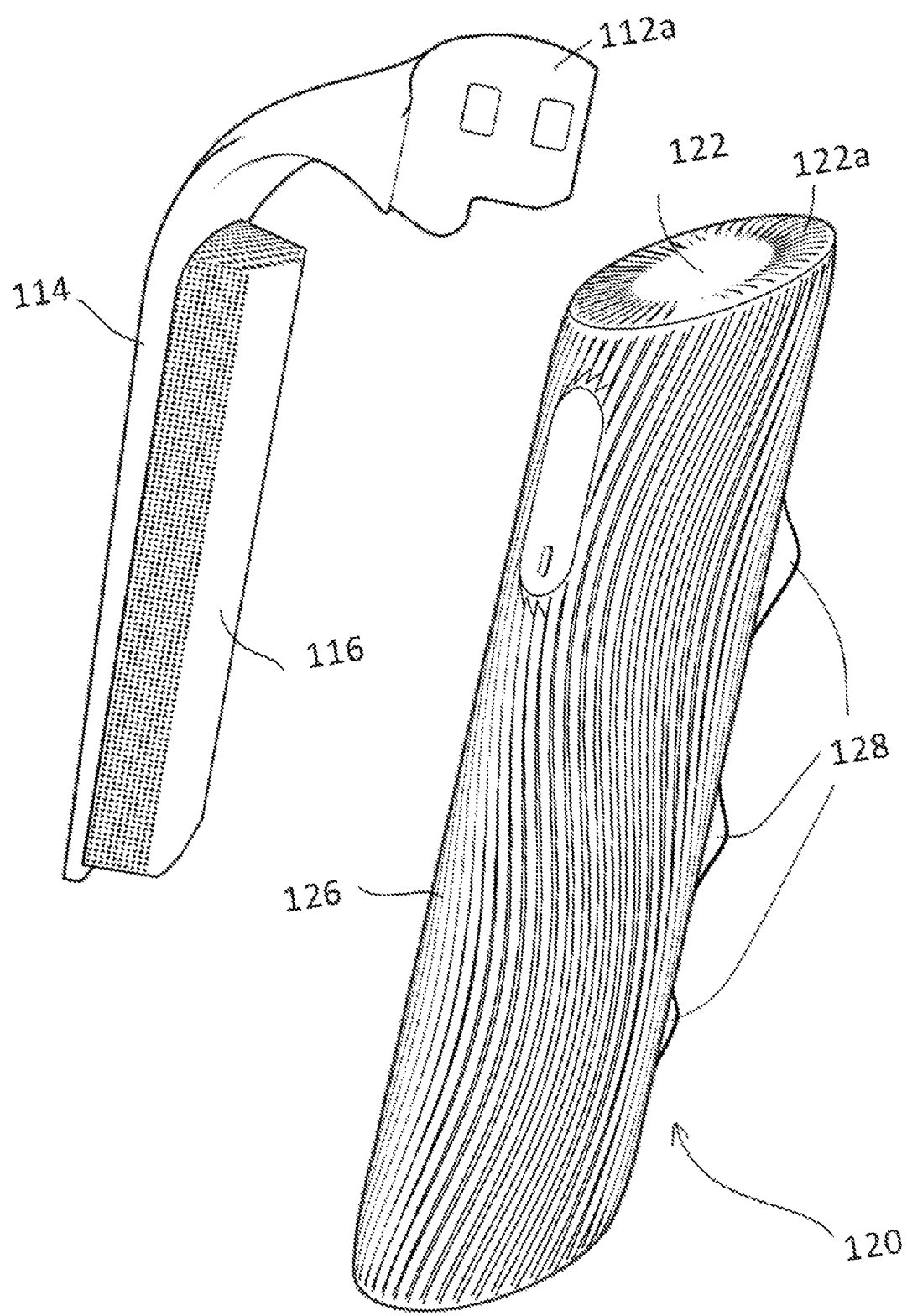
FIG. 2 shows the device of FIG. 1 with the mounting clip detached.
Figure 3:
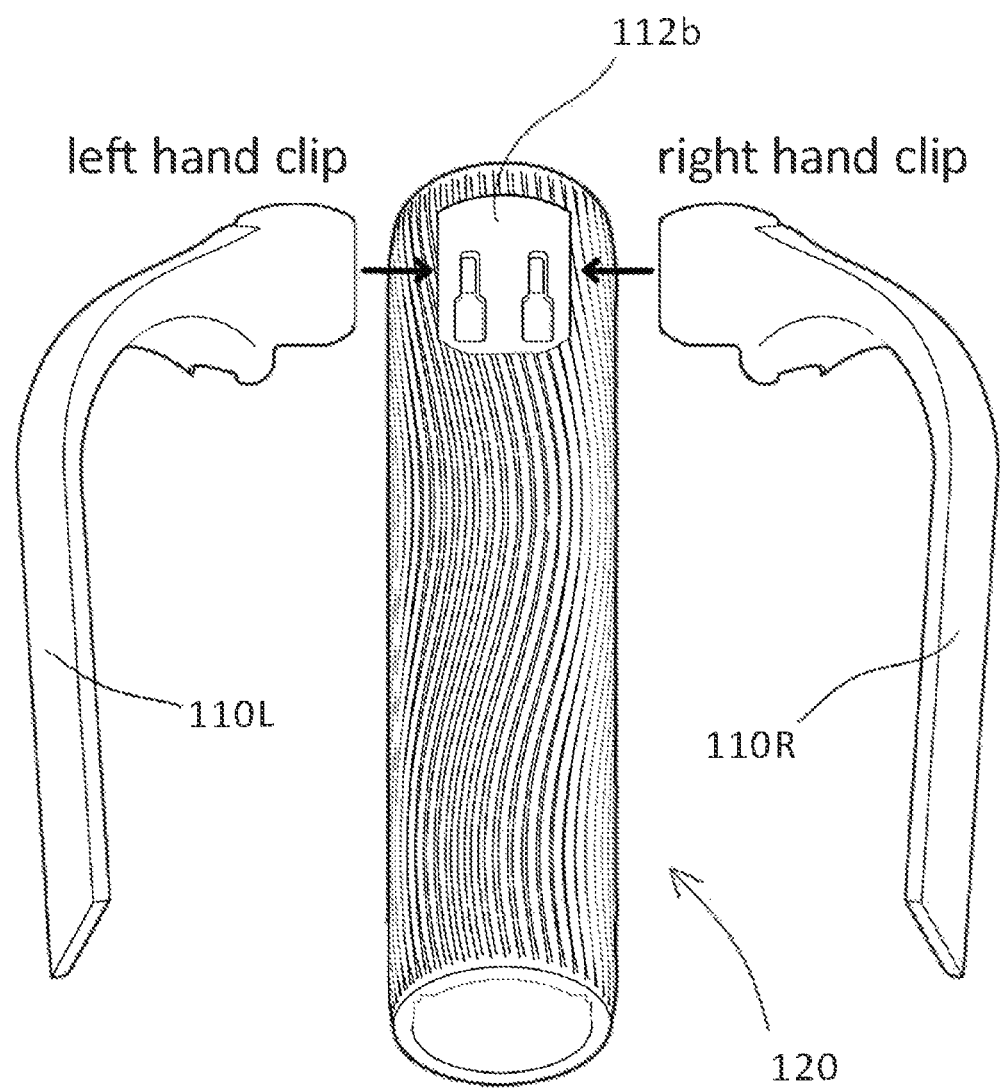
FIG. 3 shows a left and right hand mounting clip for the device of FIG. 1.

The mounting portion 110 is attachable/detachable from the handle portion 120 at a coupling 112a, as shown in FIG. 2. The coupling 112a may engage or interlock with a corresponding coupling 112b located on the handle portion 120 (see FIG. 3). This may allow different sized and/or shaped mounting portions 110 to be used interchangeably, e.g., to fit users with fingers 550 of different thicknesses, or to fit either the left or right hand as shown in FIG. 3 and discussed further below.

The handle portion 120 is a generally elongate body with a length and width sized and/or dimensioned such that, preferably, all four fingers 550 of a hand 500 are accommodated along the length of the handle portion side(s) 124 and can wrap around a substantial portion of the handle portion side(s) 124. In the example shown, the handle portion 120 is substantially cylindrical, but it may take on other forms. For example, alternatively the handle portion 120 may be substantially square or triangular in cross-section, and/or may be ergonomically shaped, e.g., to conform to the shape of the hand 500 and/or fingers 550 when in the closed position (not shown). The diameter or width of the handle portion 120 may be in the range of substantially 2 to 4 cm. The length of the handle portion 120 may be in the range of substantially 6 to 16 cm.

The handle portion 120 comprises a non-conductive outer skin 126, as indicated in FIG. 2. The outer skin 126 is the interface layer that the user's finger 550, thumb or hand 500 touches. The non-conductive material of the outer skin 126 may be substantially soft or rigid.

Figures 4A, 4B:
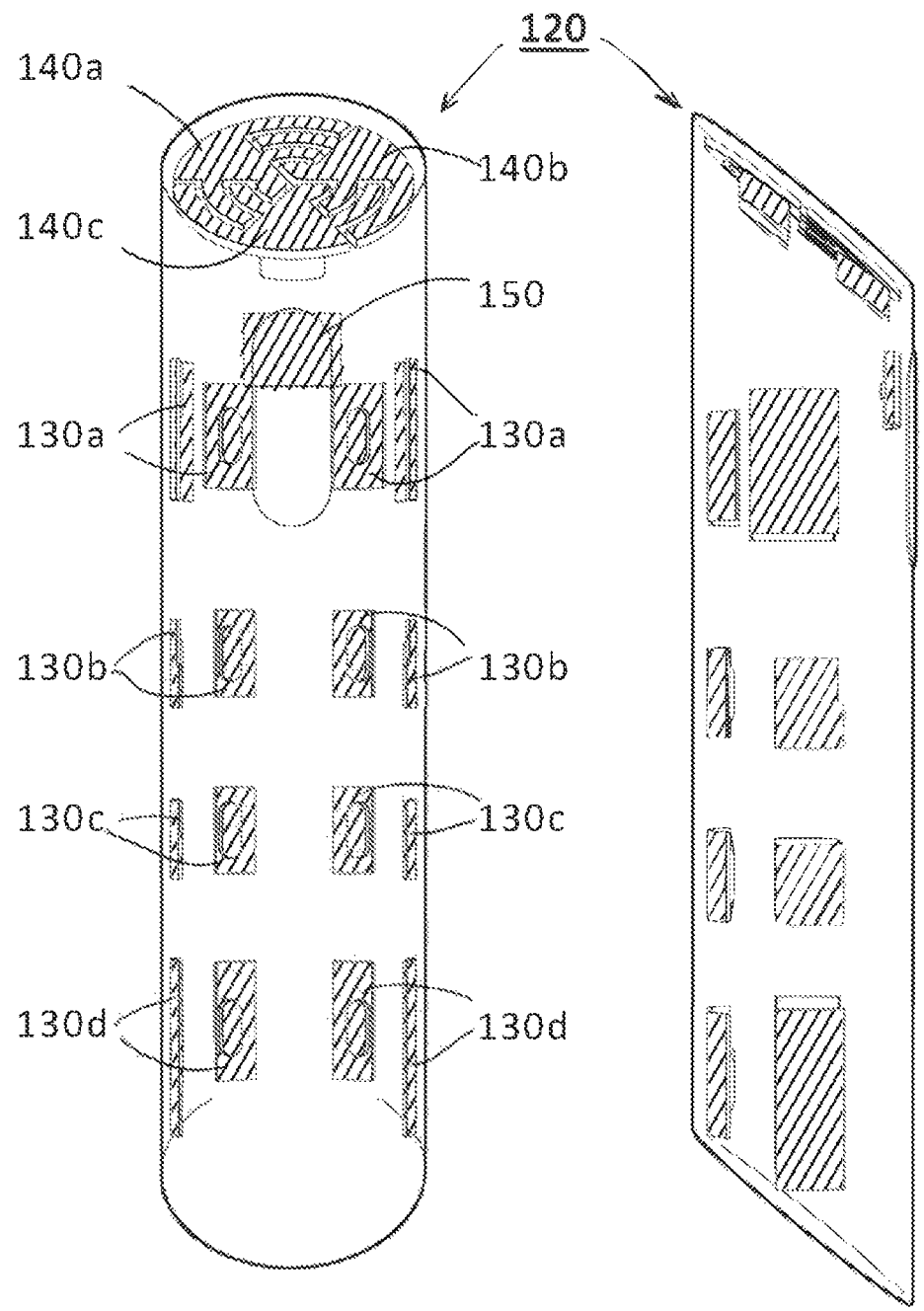
FIGS. 4A and 4B show an example arrangement of sensing electrode in the device of FIGS. 1 to 3.

The handle portion 120 further comprises a plurality of touch sensing electrodes or electrode portions 130a-130d, 140a-140c, 150 (see FIGS. 4A-B). The touch sensing electrodes/portions 130a-130d, 140a-140c, 150 are formed of or comprise a non-metallic conductive material, such as conductive plastics (e.g., conductive acrylonitrile butadiene styrene (ABS), conductive ethylene vinyl acetate (EVA), or conductive polyurethane (PU)). The touch sensing electrodes 130a-130d, 140a-140c, 150 are located beneath the outer skin 128 and couple capacitively to a nearby conductive object, such as an operator's finger 550, thumb 560 or hand 500. Each touch sensing electrode/electrode portion 130a-130d, 140a-140c, 150 is configured to provide one or more electrical signals in response to a change in capacitance between the respective sensing electrode/electrode portion 130a-130d, 140a-140c, 150 and a portion of the user's finger, thumb 560 or hand 500 being near to or in contact with the outer skin 126 above the respective touch sensing electrode 130a-130d, 140c-140d, 150.

The outer skin 126 provides a non-conductive spacer layer to set up the capacitance between the finger(s) 550, thumb 560 or hand 500 and the touch sensing electrode/electrode portion 130a-130d, 140c-140d, 150. The outer skin 126 may be formed and/or provided on or over the touch sensing electrode 130a-130d, 140c-140d, 150. The touch sensing electrodes/electrode portions 130a-130d, 140c-140d, 150 may be embedded or formed at least partially within the outer skin 126. Alternatively or additionally, a separate layer of non-conductive material may be provided between touch sensing electrode/electrode portions 130a-130d, 140c-140d, 150 and the outer skin 126.

An example electrode arrangement is shown in FIGS. 4A and 4B. Different touch sensing electrodes may provide different functions. The touch sensing electrodes/electrode portions 130a-130d are configured and/or arranged to sense one or more fingers 550 being near to or in contact with the outer skin 126 above the respective sensing electrodes 130a-130d. The finger sensing electrodes 130a-130d are spatially distributed around the handle portion 120, such that each finger sensing electrode 130a-130d is responsive to the capacitance between themselves and a different portion of a user's finger(s) 550. The finger sensing electrodes 130a-130d are further arranged around the handle portion 120 in groups or sets, with each set of finger sensing electrodes 130a-130d being provided for a different finger 550. In the example of FIG. 4A, electrodes 130a may form a first set of finger sensing electrodes for the index finger, electrodes 130b may form a second set of finger sensing electrodes for the middle finger, electrodes 130c may form a third set of finger sensing electrodes for the third finger, and electrodes 130d may form a fourth set of finger sensing electrodes for the fourth finger. Although four sets of finger sensing electrodes 130a-130d are shown, it will be appreciated that the device 100 may comprise one, two three or four sets, depending on the application of the device 100. Further, although each set in the embodiment of FIG. 4A has four electrodes, in other embodiments each set may have fewer electrodes or a greater number of electrodes.

The touch sensing electrodes 140a-140c are configured and arranged to sense an operator's thumb 560 being near to or in contact with the outer skin 126 above the respective thumb sensing electrodes 140a-140c. Thumb sensing electrodes 140a-140c comprise part of a thumb track pad 122a positioned at an end 122 of the handle portion 120, as shown in FIGS. 1A, 1B and 2.

The device 100 may further comprise an input 170 and/or output 172 element disposed about the handle portion 120, such as a control input, power button, light emitting device, sound emitting device. The input element(s) 170 may comprise a touch sensing electrode 150 (see FIG. 4A) to sense an operator's finger 550, thumb 560 or hand 500 being near to or in contact with the outer skin 126 above the respective touch sensing electrode 150. The output element 172, e.g., a light emitting device, may be actuated in response to the electrical signal provided by the operator touching the input element 170.

The device 100 further comprises a measurement module 300 configured to receive the or each electrical signal from the touch sensing electrodes 130a-130d, 140a-140c, 150. The measurement module 300 is configured to determine a position of the operator's finger 550, thumb 560 or hand 500 relative to one or more touch sensing electrodes 130a-130d, 140a-140c based on the or each electrical signal received (discussed further below with reference to FIG. 6). The measurement module 300 comprises a microcontroller unit for processing the electrical signals received from the electrodes and determining positions of the finger 550. The measurement module 300 may further comprise additional hardware, including a wireless communication unit (e.g., Bluetooth, Bluetooth low energy, or WiFi) for communicating with a remote computing device, and a power management unit for powering the measurement module 300. For example, the power management unit may be connectable to a battery, or the power management unit may comprise a re-chargeable battery. The measurement module 300 may further comprise an inertial measurement unit (IMU). The IMU may comprise an accelerometer, gyroscope and/or a magnetometer (e.g., the IMU may have 9 degrees of freedom).

Each touch sensing electrode 130a-130d, 140a-140c, 150 is individually addressable by the measurement module 300. The measurement module 300 comprises one or more electrical connectors 310 configured to mechanically (and electrically) contact the touch sensing electrodes 130a-130d, 140a-140c, 150 (i.e., an electrical connection that does not require solder or other form of bonding agent). The measurement module 300 is mountable to a fixed position within the handle portion 120 in which the connectors 310 mechanically contact the touch sensing electrode 130a-130d, 140a-140c, 150. In other words, the measurement module 300 is configured to be simply "plugged" into the handle portion 120 (e.g., during assembly of the device 100). Additionally, the measurement module 300 may be unmounted or unplugged from the handle portion 120, if necessary. This direct connection arrangement greatly simplifies the manufacture and assembly or the device 100, as will be discussed in more detail with reference to FIG. 5.

The handle portion 120 may further comprise a substantially rigid hollow core 200 to support the touch sensing electrodes 130a-130d, 140a-140c, 150, the outer skin 126 and/or the overall shape/structure of the handle portion 120. The touch sensing electrodes 130a-130d, 140a-140c, 150 are be embedded or formed at least partially in or on the core 200, and the outer skin 126 may be formed or provided over the touch sensing electrodes 130a-130d, 140a-140c, 150 and the core 200. The core 200 is formed of or comprises a non-conductive material, e.g., to avoid shorting the touch sensing electrodes 130a-130d, 140a-140c, 150. The core 200 may comprise the coupling 112b used to connect the mounting portion 110 to the handle portion 120.

To simplify manufacture of the device 100, the core 200 may be formed from two or more shell portions 210a, 210b that join together, e.g., during assembly (discussed further with reference to FIGS. 5A-5C). Each shell portion 210a, 210b may comprise one or more interlocking members 212 for securing the shell portions 210a, 210b together. The interlocking member(s) 212 on each shell portion may be configured to overlap or otherwise fit together when the two shell portions are brought together. For example, the interlocking member(s) 212 may be or comprise one or more male and female type connectors, projections, recesses and/or clips.

In an alternative embodiment, the outer skin 126 may be or comprise a substantially rigid non-conductive material which serves as an interface layer, and supports both the touch sensing electrodes 130a-130d, 140a-140c, 150 and the overall shape/structure of the handle portion 120 (i.e., the outer skin may be the core 200).

The measurement module 300 is mountable within the cavity of the core to the fixed position. As such, the connector(s) 310 contact the touch sensing electrodes 130a-130d, 140a-140c, 150 directly from the cavity side of the core 200. To facilitate this, each touch sensing electrodes 130a-130d, 140a-140c, 150 is formed over, in, and/or extends through an opening 205 in the wall 207 of the core 200, such that at least a contacting portion 131 of a respective electrode 130a, 130b, 130c, 130d is exposed and accessible from the cavity side by a connector 310 (see FIG. 5A). For example, the contacting portion 131 may extend through an opening 205 into the cavity as shown in FIG. 5C. Alternatively, the contacting portion 131 may be or comprise an interior surface of the touch sensing electrode 130a-130d, 140a-140c, 150 that extends over an opening 205, or the contacting portion 131 may extend at least partially into the opening 205. In these latter two examples, each connector 310 may extend at least partially into the opening 205 to contact the respective touch sensing electrode 130a-130d, 140a-140c, 150.

The or each connector 310 comprises a substantially rigid mating portion that bears against the contacting portion 131 when the measurement module 300 is mounted in the fixed portion. The mating portion may additionally be configured to at least partially deform or penetrate the exposed contacting portion 131 to make an electrical contact with it. The mating portion may be or comprise one or more metal projections, a pin, a castellated pad, a clip pin, or any other form of metal connector that allows a secure mechanical connection to the electrode (see FIGS. 5B and 5C). When the measurement module 300 is in the fixed position, the mating portion may be biased towards the contacting portion 131 of the electrode, and/or vice versa. For example, the pin or projection may be spring loaded. Additionally or alternatively, the non-metallic conductive material of the contacting portion 310 may be substantially resilient and apply a reaction force against the mating portion in response to deformation (e.g., compression or bending) by the mating portion.

The touch sensing electrodes 130a-130d, 140c-140d, 150, the outer skin 126 and/or the core 200 are moulded components formed of or comprising thermo-formable materials. This allows the touch sensing electrode 130a-130d, 140c-140d, 150, the outer skin 126 and/or the core 200 to be formed by a moulding process, such as injection moulding, heat pressing or any other thermo-forming process. The touch sensing electrode 130a-130d, 140c-140d, 150, the outer skin 126 and/or the core 200 can be moulded separately and then post-assembled together. Alternatively, the core 200 and the touch sensing electrode 130a-130d, 140c-140d, 150 (and optionally the outer skin 126) may be formed by an over-moulding process (i.e., moulded using the same tool set).

The material used for the outer skin 126 and the core 200 may be the same or different. In an embodiment, the outer skin 126 is substantially soft and formed of non-conductive silicon rubber, EVA or polyurethane (PU). The skin may also comprise an exterior coating or layer, such as fabric or synthetic leather. Suitable materials for the casing 200 include but are not limited to non-conductive plastics, such as PU, ABS plastic, or polycarbonate (PC).

The touch sensing electrode 130a-130d, 140c-140d, 150 are formed simultaneously using a single mould to have pre-defined 3D electrode shapes, spacings and arrangements with the thermo-forming processes described above.

In the embodiment of FIGS. 4 and 5, each touch sensing electrode 130a-130d, 140a-140c, 150 is a separate moulded electrically isolated electrode, and is connectable to a separate connector 310. In an alternative embodiment (not shown), two or more touch sensing electrodes, e.g., in a finger sensing set 130a-130d or a thumb trackpad set 140a-140c, may be physically and/or electrically connected to each other. In this case, each connected electrode 130a-130d, 140a-140c may be an electrode portion (e.g., a portion of a unitary piece of the non-metallic conductive material) which is similarly connectable to a separate connector 310 at a contacting portion 131 to provide a different electrical signal. Connected electrodes portions 130a-130d, 140a-140c may be thermo-formed as a unitary piece of non-metallic conductive material, such that only one set of mould tooling is needed. Connected electrode portions 130a-130d, 140a-140c may simply manufacture of the sensor device 100, e.g., by reducing the number of parts that need assembling.

The outer skin 126 may be formed with a textured or profiled exterior surface, e.g., to increase grip (see FIGS. 1A and 1B). Additionally, the outer skin 126 may be formed with one or more raised or hill structures 128 disposed at a back side of the handle portion 120 facing the mounting portion 110, as shown in FIG. 2. Where present, the hill structures 128 are configured to locate the fingers 550 on the handle portion 120 at a predetermined position along the length of the handle portion 120 and/or with a predetermined separation. For example, a hill structure 126 may be arranged to locate and separate the index finger and middle finger. Additional hill structures 128 may be used to locate and separate the middle finger and the third finger, and/or the third finger and fourth finger, as shown.

The touch sensing electrodes (or electrode portions) 130a-130d, 140a-140c, 150 can be formed or moulded into almost any arbitrary size, shape or three-dimensional (3D) form by the nature of the moulding process. For example, the touch sensing electrodes 130a-130d, 140a-140c, 150 may conform the exterior shape of the handle portion 120, core 200 and/or the interior/exterior surface of the outer skin 126 regardless of complexity. This significantly increases the design freedom for the electrode shape, arrangement and the device 100 itself.

The touch sensing electrode portion(s) have 3D volumes and can cover larger areas enabling them to be more sensitive to small capacitance changes and produce larger signal changes compared to the typically smaller metal electrode counterparts.

For example, in a simplistic parallel plate capacitor model, the capacitance C between a touch sensing electrode 130a-130d, 140a-140c, 150 and a portion of the finger 550 near to/over the touch sensing electrode 130a-130d, 140a-140c, 150 is proportional to the overlap between the finger portion's contact area $A_F$ (i.e., the surface area of the finger 550 contacting the outer skin 126) and the electrode's sensing area $A_E$, and is inversely proportional to the electrode-finger separation d (e.g., the spacer layer thickness), according to $C \propto A_E A_F/(d*(A_E+A_F))$. For sensor devices with relatively small electrodes compared to the width of a finger (such as those using conventional metal electrodes), $A_E$ is typically much smaller than $A_F$ and the resulting capacitance and electrical signal produced for a given separation d will be small compared to that produced using larger electrodes that are comparable to the width of the finger 550, such as the moulded electrodes 130a-130d, 140a-140c, 150.

The approach in conventional technologies is to compensate for small $A_E$ by reducing the thickness d of the spacer layer (i.e., outer skin). However, this approach places technical limitations on the form and dielectric properties of the spacer layer material, and the construction of a sensor device itself. Advantageously, the moulded non-metallic touch sensing electrodes 130a-130d, 140a-140c, 150 can be comparable to or even larger than a typical (maximum) finger contact area $A_F$, relaxing the technical requirements of the outer skin 126 (e.g., thickness and form) compared to conventional sensor devices, which in turn simplifies manufacture and assembly of the device (discussed further below).

In addition, the electrical signals provided by each moulded non-metallic touch sensing electrode 130a-130d, 140a-140c, 150 and its responsivity can be tailored through its size and shape. For example, the functional form of the signal change between the minimum and maximum signal values can be tailored to be substantially smooth and gradual. This allows the touch sensing electrode portion(s) to sense/resolve a wider range of finger/hand movements.

For example, as the finger 500 position changes between an open and closed position (i.e., when the user grips/ungrips the handle portion 120), the finger contact area $A_F$ will change according to the pressure applied to the outer skin 126 by the operator. For sensor devices using conventional metal electrodes where the active sensing area $A_E$ is relatively small compared to the width of a finger, the overlap area and corresponding electrical signal will change rapidly from a minimum to a maximum at the point where the finger 550 moves into contact with the spacer layer, or vice versa (since the finger contact area $A_F$ instantly/rapidly fills the sensing area $A_E$). By contrast, because the moulded non-metallic touch sensing electrodes 130a-130d, 140a-140c, 150 can be comparable to or larger than the width of the finger 550, the transition from a minimum to a maximum electrical signal as the finger 550 moves between an open and closed position can be relatively smooth and controlled. This allows the device 100 to determine a wider range of finger positions and/or movements (discussed in more detail below with reference to FIG. 6).

Figure 6A:
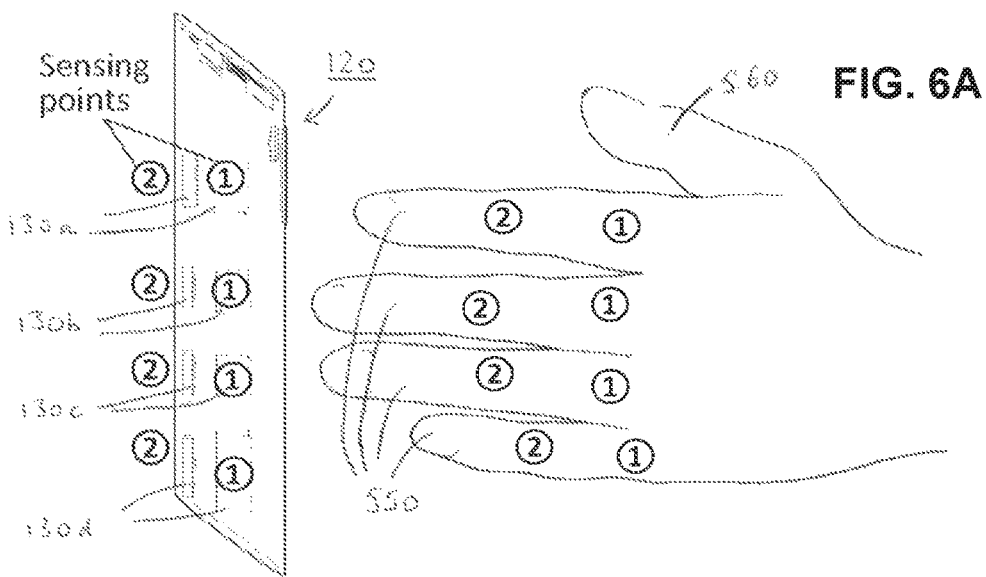
FIGS. 6A-6C illustrate the operation of the device.
Figure 6B:
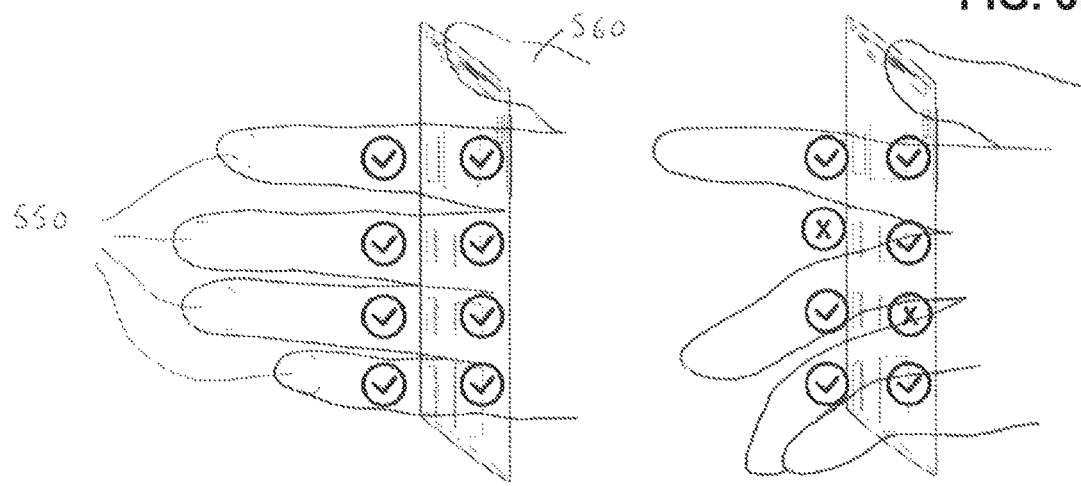
Figure 6C:
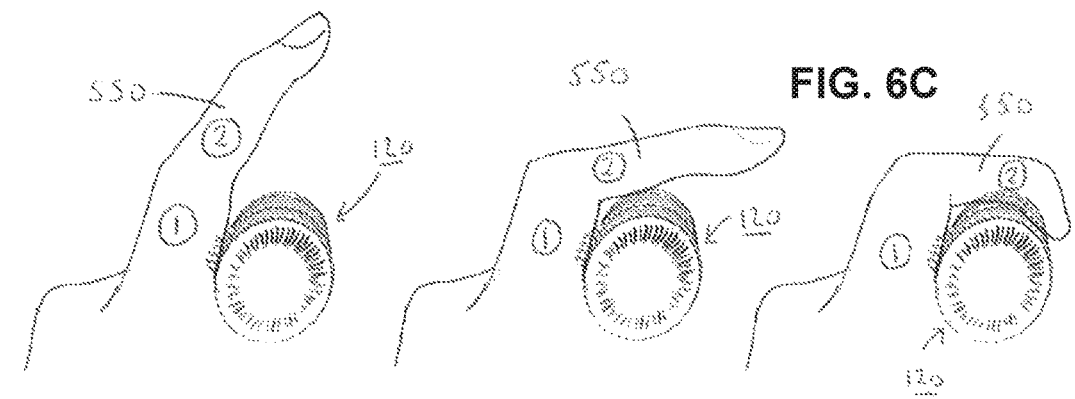

FIGS. 6A-6C illustrate the operation of the device 100. In use, the device 100 is mounted to an operator's hand 500 at an operating position, as shown in FIGS. 1A and 1B. The electrode arrangement of the device 100 ensures that each finger 550 can be correlated with one or more electrical signals, each electrical signal mapping to a different portion of the finger 550. In other words, each finger sensing electrodes 130a-130d provides an electrical signal associated with a specific portion of the finger 550. Preferably, the device 100 is mounted to the hand 500 in an operating position such that separate finger sensing electrodes 130a-130d correlates with the position of the proximal phalanges 1 and intermediate phalanges 2 of a finger 550, as indicated in FIG. 6A. The phalanges 1, 2 comprise the pads of the finger 550 that typically contact the outer skin 126 when in the closed position. As such, each set of finger sensing electrodes 130a-130d may comprise at least one first electrode arranged to detect the proximity of the proximal phalange 1 and at least one second electrode arranged to detect the proximity of the intermediate phalange 2. Each finger sensing electrodes 130a-130d may comprise a third electrode arranged to detect the proximity of the distal phalange 3, but this is not essential to determine the position of the finger 550, as discussed below.

When an operator's finger 550, thumb 560 or hand 500 moves close to, touches, or move across the surface of the outer skin 126, an electrical signal is generated by one or more touch sensing electrodes (or electrode portions) 130a-130d, 140a-140c, 150 and is received by the measurement module 300 in near real time. The measurement module 300 may be configured to scan through each connector 310 connected to the touch sensing electrodes 130a-130d, 140a-140c, 150 sequentially (i.e., one by one) to measure each electrical signal separately. The measurement module 300 may comprise a multiplexer function. The scan frequency may be sufficiently high compared to a typical movement speed of a finger 550, thumb 560 or hand 500 to minimise any measurement lag, such that an operator perceives the measurement/detection to be in real-time. For example, the scan rate may be in the range 100-200 Hz. The scan rate may be slower or faster depending on the application. In this way, only one sensing point (i.e., a contacting portion 131) is actively connected to the measurement module 300 at a time. For example, while an electrical signal is being measured from one sensing point, other (non-active) sensing points may be disconnected from the measurement module 300. This may be achieved via one or more switching circuits controlled by the measurement module 300 or software. The switching circuits may be internal to the measurement module 300 (e.g., part of the microcontroller unit) or in an external intermediate unit connected to the measurement module 300 and controlled by software. Alternatively, the measurement module 300 may be configured to read/measure the electrical signals received at each connector 310 simultaneously.

Advantageously, scanning through the connectors 310 one by one ensures that no short circuits are formed between any given pair of connectors 310 (e.g., through a two or more connected electrode portions). As such, the scanning method allows the touch sensing electrodes 130a-130d, 140a-140c, 150 to be connected and therefore be moulded using one mould. In this case, the touch sensing electrode portions 130a, 130b, 130c, 130d are connected via thin connecting structures made out of the same non-metallic conductive material during the same moulding process, such that the resistance between two close-by electrode portions is sufficiently high, such that the electrical signal(s) received by a particular connector 310 is predominately affected by the electrode portion it is connected to. Through this, the measurement method allows multi-finger sensing with a unitary electrode.

Similarly, although each touch sensing electrode or electrode portion 130a-130d, 140a-140c, 150 in FIGS. 4 and 5 is shown as being connected to a single connector 310, in other examples, each touch sensing electrode or electrode portion 130a-130d, 140a-140c, 150 may be connected to two or more connectors 310 at different sensing points/contacting portions 131, each sensing point/contacting portion 131 providing a separate electrical signal to the measurement module 300 from a strategic point on the respective electrode/electrode portion.

Each finger sensing electrode (or electrode portion) 130a-130d provides an electrical signal between a maximum value and a minimum value representing how open or closed the finger 550/hand 500 is. A minimum value may be provided when the finger 550 is completely flat open, as shown in FIG. 1A, such that the finger phalanges 1, 2, 3 do not contact the outer skin 126 over the respective finger sensing electrodes (or electrode portions) 130a-130d. A maximum value may be provided when the finger 550 is closed or curled/wrapped around the handle portion 120, such that the finger phalanges 1, 2, 3 contact the outer skin 126 over the respective finger sensing electrodes (or electrode portions) 130a-130d. As discussed earlier, the moulded finger sensing electrodes (or electrode portions) 130a-130d may be shaped and/or sized such that at least one dimension of the sensing area $A_E$ is comparable to the width of a finger 500, to make the change from minimum to maximum valve large and/or smooth. Each finger sensing electrodes (or electrode portions) 130a-130d is therefore capable of providing a range of intermediate signal values while the respective finger portion is in contact with the outer skin 126 above the respective electrode, with each intermediate value representing a different position or pose of the finger 550.

The operating position is preferably one where the device 10 is mounted between the first and second knuckles (between the MCP joint and the PIP joint) of the fingers 550 or on the proximal phalanges, as shown in FIGS. 1A and 1B. As such, the proximal phalange 1 is typically in contact with the outer skin 126 above the first electrode for the whole range of movements between the open and closed positions and provides a corresponding high/non-zero value signal. This first electrode signal may be used to compare to each of the other signals in the electrode set to improve the robustness of the finger position measurement and avoid miss-touches. For example, because the first electrodes map to the proximal phalanges close to the knuckle, it is difficult to activate it with the wrong finger. The signal valve/level from the first electrode can then be used as a filter for the second electrode, and third electrode and so on, in a differential-type measurement to discriminate between genuine touches and miss-touches.

Using this technique, the device 100 can determine lateral rotation (spreading) of the finger(s) 550. This is illustrated in FIG. 6B which shows the natural alignment of fingers 550 with the device 100 (on the left) and the lateral movement of fingers (on the right) which may be determined. In the example shown in FIG. 6B (right), the second electrode of the third finger set 130c is triggered without the first electrode of that set being triggered (or the second electrode has a much higher value than the first electrode of the third finger set 130c), indicating that the second (middle) finger's lateral movement has activated the third finger's second electrode. As described above, the finger sensing electrodes (or electrode portions) 130a-130d are formed to have large enough sensing areas, such that even when the operator's fingers 550 are not perfectly aligned to the electrode positions, a clear signal change is still provided that indicates touch and/or movement from which the finger position can be determined. The electrical signals can be interpreted as forming a 'heat map' over the handle portion 120 indicating both the contact/touch areas as well as pressure of the fingers 550. Machine learning methods may be employed to translate the signal 'heat map' to gestures/finger positions.

In addition to detecting finger lateral movement, the use of signals from pairs of electrodes in a set enables estimation of the position and/or pose of the proximal 1, intermediate 2 and distal 3 phalanges separately. The first electrode maps to the rotation of the first knuckle (MCP joint) which determines the position of the proximal phalange 1. The rotations of the second knuckle (PIP joint) and the third knuckle (DIP joint) are linked, e.g., it is typically not possible to bend the third knuckle without bending the second knuckle, but it is possible to bend the second knuckle without bending the third knuckle (e.g., see FIG. 6C). As such, it is possible to infer or derive from the signals received from the first to third electrodes in a set the rotation of the first knuckle and position/pose of the proximal phalange 1, and then extrapolate the rotation of the second and third knuckles. The pose or position of the intermediate phalange 2 (and thus also the distal phalange 3) can then be estimated when the intermediate phalange 2 is not in contact with the outer skin 126 (e.g., see left part of FIG. 6C).

The finger or hand positions determined by the measurement module 300 may be transmitted to a computing device via the wireless communication unit, for example to display and/or animate the hand 500 or fingers 550 and/or to control one or more functions of the computing device based on the finger positions.

An alternative approach to determining the position of the finger 550/hand 500 involves calibrating the device 100 at two positions representing a completely open position and a closed position (at the two extremes of possible movement). Intermediate positions may be calibrated as well. This may comprise storing a set of signal values for each finger position. In use, the measurement signal values can be compared to the stored values to derive a finger position. Intermediate positions (i.e., in between the calibrated positioned) may then be derived by interpolating between the calibration points.

The calibration values used to drive the interpolation can be calculated from a combination of the differential two-point sensing described above (filtering for miss-touches) multiplied by a weighting factor in the range of 0 to 1. It will be appreciated that numerous algorithms are possible, but a representative one can be specified mathematically as:

$$f \geq s \rightarrow (f\alpha + \beta s)$$

$$f \leq s \rightarrow (f\alpha),$$

where f and s are the calibrated values for the first and second electrodes, and $\alpha$ and $\beta$ are weighting factors for f and s respectively that sum to 1. Supporting this style of interpolation rather than encoding the finger positions directly means that an interface can be established between the device 100 and computer programs that use this for animation.

For both of the above methods, to compensate for the range of different hand sizes and conditions that a typical device 100 may encounter, the measurement module 300 may be configured to 'auto-calibrate' the device 100 by making an estimate of the signal values for each electrode that correspond to the 'closed' and 'open' hand positions (see above) at the extremes of the range of possible motion, and then adjusting the estimate of these values in response to changes in the measured signal values.

Machine learning methods may also be employed to improve the sensing robustness and customisation of the device 100 which allows the device 100 to become better for the individual user over time. Such methods translate data sets of signal values into position and gesture estimations. Machine learning models are trained on data sets with labelled inputs and expected position outputs (supervised learning), providing models which can estimate position. These predicted positions then get taken to train a second model using these and expected gesture outputs (again, supervised learning) to produce models which can classify gestures. This two-step process decouples the gesture recognition from the hardware, and makes it more practical to industrial uses.

Advantageously, the device 100 may be used for either the left hand or the right hand 500 by exchanging the mounting portion 110 for a left or right handed mounting portion 110 (see FIG. 3) and using the same handle portion 120. For this purpose, the electrode arrangement in the handle portion 120 is substantially symmetrically. The measurement module 300 may be configured to switch between a left hand mode and a right hand mode to re-configure how the electrical signals received at the connectors 310 are mapped to the position of the finger 550 or hand 500. Depending on the arrangement of electrodes and which hand the operator is using, some finger sensing electrodes or electrode portions 130a-130d may be located beneath the palm of the hand 500. Such electrodes can remain active and be used to determine a pressure of grip and/or which hand the operator is using, e.g., from the characteristic left hand or right hand heat map determined by the measurement module 300.

Alternatively or additionally, the handle portion 120 may further comprises a switching mechanism (not shown) configured to provide a control signal to the measurement module 300 to switch the measurement module 300 between the left hand mode and the right hand mode. The measurement module 300 is then configured to determine a position of a left hand finger based on the or each electrical signal and the control signal when in the left hand mode, and to determine a position of a right hand finger based on the or each electrical signal and the control signal when in the right hand mode, as described above.

The switching mechanism may be or comprise one of the further inputs 170. The switching mechanism may be or comprise a switch, button and/or sensor disposed on or in the handle portion 120. The switching mechanism may be actuated manually by the operator, or upon connection of the mounting portion 110 to the handle portion 120. For example, the switching mechanism may be incorporated in or part of the coupling 112b.

The use of thermo-formable non-metallic materials offers a unique manufacture and assembly solution for the device 100. In particular, the measurement module 300 can directly (mechanically) connect to the electrodes 130a, 130b, 130c, 130d upon mounting it within the handle portion 120, to form a complete device 100 without using any further wiring or soldering.

A general method of manufacturing the device 100 according to the invention comprises two steps. In step 1, the handle portion 120 is at least partially formed and/or assembled. This comprises moulding the touch sensing electrodes 130a-130d, 140a-140c, 150 or one or more unitary sensing electrodes with electrode portions 130a-130d, 140a-140c, 150 from a non-metallic conductive material and providing a moulded non-conductive material as a core 200 to mount/support each electrode or electrode portion 130a-130d, 140a-140c, 150.

In step 2, a measurement module 300 is provided and mounted within the handle portion 120 to connect to the electrodes (or portions) 130a-130d, 140a-140c, 150. The measurement module 300 can be mounted generally in two different ways. In one embodiment, mounting the measurement module 300 comprises moving or inserting the measurement module 300 into an assembled handle portion 120 (not shown). In another embodiment, the handle portion 120 is assembled around the mounting module 300 (described in more detail below with reference to FIG. 5).

Where the core 200 is not provided on or over the electrodes (or portions) 130a-130d, 140a-140c, 150, a further a further non-conductive moulded material is provided over or on each electrode (or portion) 130a-130d, 140a-140c, 150 as an outer skin (before or after mounting the measurement module 300). This can be an additional over-moulding step or an assembling step where the outer skin is moulded independently. Sequences of the steps are interchangeable.

An example method of manufacturing the device 100 is illustrated in FIGS. 5A-5D, in which the handle portion 120 is assembled around the mounting module 300. In step S1 (see FIG. 5A), the two shell portions 210*a*, 210*b* of the hollow core 200 are moulded from a substantially rigid non-conductive material. The electrodes (or portions) 130*a*-130*d*, 140*a*-140*c*, 150 are then moulded on or over each shell portion 210*a*, 210*b* of the core 200 from a non-metallic conductive material (this may be an over-moulding process). In step S2 (see FIG. 5B), a measurement unit 300 comprising a plurality of connectors 310 is provided and mounted within the cavity of the core 200 to contact the contacting portions 131 of the electrodes (or portions) 130*a*-130*d*, 140*a*-140*c*, 150. This is achieved by joining or assembling the two shell portions 210*a*, 210*b* around the measurement module 300 in the direction generally indicated by the arrows. Assembling the two shell portions 210*a*, 210*b* as shown may cause the interlocking members 212 on each shell portion 210*a*, 210*b* to engage each other and lock the shell portions 210*a*, 210*b* together. As the shell portions 210*a*, 210*b* are joined/assembled around the measurement module 300, the connectors 310 engage and mechanically contact the contacting portions 131 of the electrodes (or portions) 130*a*-130*d*, 140*a*-140*c*, 150, as shown in FIG. 5C. The measurement module 300 may be held in place during this step (e.g., via a tab 315 at one end of the measurement module 300).

Each shell portion 210*a*, 210*b* may optionally comprise one or more guiding structures (such as recesses, channels or posts) to guide the measurement module 300 into the correction fixed position as the shell portions 210*a*, 210*b* are joined. This may help to ensure the connectors 310 properly contact each electrode (or portion) 130*a*-130*d*, 140*a*-140*c*, 150.

In step S3 (see FIG. 5D), the outer skin 126 is moulded from a non-conductive malleable material and is provided on or over the core 200/electrode assembly to complete the device 100. This may comprise a further over-moulding step. Alternatively, this may comprise sliding or fitting the moulded outer skin 126 over the core 200/electrode assembly.

Alternatively, the measurement module 300 can be mounted into the core 200/electrode assembly (not shown). For example, the step S1 may further comprise joining or assembling the two shell portions 210*a*, 210*b* to form the casing 200/electrode assembly (before or after moulding the electrodes (or portions) 130*a*-130*d*, 140*a*-140*c*, 150 on or over each shell portion 210*a*, 210*b*) and step S2 may comprise moving or inserting the measurement module 300 into the cavity formed by the core 200 to contact the contacting portions 131 of the electrodes 130*a*, 130*b*, 130*c*, 130*d*. In this case, the core 200 need not be formed from shell portions 210*a*, 210*b* and step S1 may instead comprise moulding the unitary hollow core 200.

In both methods, the electrodes (or portions) 130*a*-130*d*, 140*a*-140*c*, 150, the core 200 and/or the outer skin 126 may be injection moulded. Further, instead of using an over-moulding process, the electrodes (or portions) 130*a*-130*d*, 140*a*-140*c*, 150 and the core 200 (and shell portions 212*a*, 210*b*) may be moulded separately and assembled together (e.g., before mounting the measurement module 300).

Optionally, where the outer skin 126 is substantially rigid a separate core 200 may not be required, since it may serve the purpose of supporting and holding the electrodes (or portions) 130*a*-130*d*, 140*a*-140*c*, 150 in place. In this case, step S1 may comprise moulding the outer skin 126 and moulding the electrodes (or portions) 130*a*-130*d*, 140*a*-140*c*, 150 onto an interior surface of the outer skin 126 (or moulding the electrodes (or portions) 130*a*-130*d*, 140*a*-140*c*, 150 and moulding the outer skin 126 on or over the electrodes 130*a*, 130*b*, 130*c*, 130*d*) to form an outer skin 126/electrode assembly. The outer skin 126 may be formed from two shell portions, similarly to the core 200.

Due to the mouldable materials used to the form the touch sensing electrodes (or portions) 130*a*-130*d*, 140*a*-140*c*, 150, core 200 and/or outer skin 126, the device 100 is substantially lightweight compared to devices using conventional sensor technologies and metal electrode materials. In an embodiment, the device 100 may have a total weight of 200 g or less, or 150 g or less.

Furthermore, the use of moulded components and mechanical interconnections greatly simplifies the manufacture and assembly of the device 100. This, together with the relatively inexpensive materials, means the cost of manufacturing the device 100 is also substantially less than sensor devices based on conventional materials and sensing technologies (e.g., using metal electrodes, wires and/or flexible circuits).

Figure 7A:
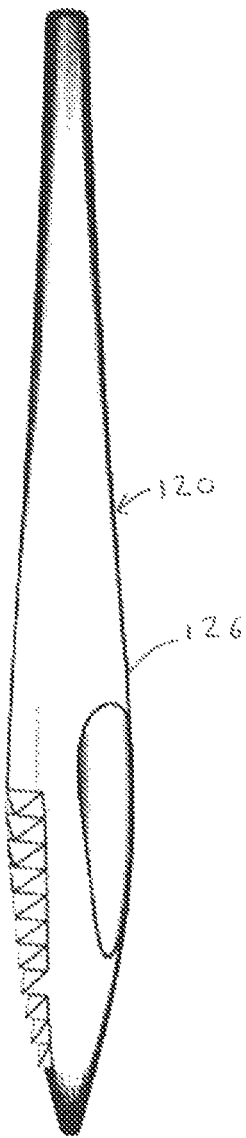
FIGS. 7A and 7B show further example sensor devices according to the invention.
Figure 7B:
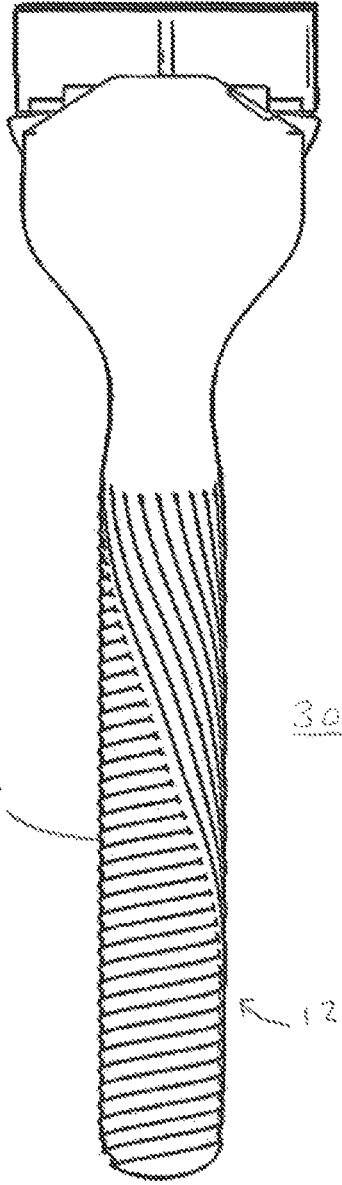

This method of manufacturing a hand-mountable sensor device can also be applied to other products with a similar format that are hand-held, such as a sensor-embedded stylus (see FIG. 7A), a sensor-embedded smart razor (see FIG. 7B), a smart toothbrush (not shown), or a sensor embedded automotive door handle (not shown). These products do not traditionally have finger/thumb or hand position detection functionality, however, could benefit from having additional sensing functions to complete tasks such as intuitive gestural control, force threshold monitoring, consumer data collection etc. The invention disclosed makes it possible to incorporate finger/hand position sensing on these devices with limited space, weight and sculptural 3D profiles.

From reading the present disclosure, other variations and modifications will be apparent to the skilled person. Such variations and modifications may involve equivalent and other features which are already known in the art, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

For the sake of completeness it is also stated that the term "comprising" does not exclude other elements or steps, the term "a" or "an" does not exclude a plurality, and any reference signs in the claims shall not be construed as limiting the scope of the claims.

The invention claimed is:

1. A sensor device for determining a position of an operator's finger/hand, comprising:
   a handle portion comprising a non-conductive core with one or more walls defining an internal cavity, and a plurality of touch sensing electrode portions supported in or on the one or more walls of the core, each touch sensing electrode portion configured to provide an electrical signal in response to the operator's finger/hand being on or near a sensing surface of the respective touch sensing electrode portion, wherein each touch sensing electrode portion comprises an exposed contacting surface located on and accessible from the cavity side of the respective touch sensing electrode portion, and a measurement module mountable within the cavity of the handle portion to a fixed position, the measurement module comprising a plurality of electrical connectors, each electrical connector configured to mechanically contact the respective contacting surface of one of the plurality of touch sensing electrode portions directly from the cavity side when the measurement module is mounted in the fixed position to receive the electrical signal from the contacted touch sensing electrode portion, the measurement module further configured to determine a position of the operator's finger/hand relative to the plurality of the touch sensing electrode portions based on each electrical signal received, wherein each touch sensing electrode portion is moulded from a thermo-formable non-metallic conductive material.

2. The device of claim 1, wherein the or each touch sensing electrode portion is at least one of: at least a part of one or more electrodes; and dimensioned for sensing touch by an operator's digit and has a dimension the width of a finger.

3. The device of claim 1, wherein the handle portion comprises a first non-conductive material at least provided on or over the or each touch sensing electrode portion.

4. The device of claim 3, wherein:
the first non-conductive material is further provided on or over the core; or
the first non-conductive material is further provided on or over the core, and wherein the core is formed of or comprises a second non-conductive material, and wherein the first non-conductive material is the same as or different to the second non-conductive material.

5. The device of claim 3, wherein the core comprises the first non-conductive material and the or each touch sensing electrode portion is defined in or on the interior surface of the first non-conductive material.

6. The device of claim 3, wherein at least one of:
the first non-conductive material is configured to provide at least one of a hand grip and a finger grip;
the first non-conductive material has a three dimensionally profiled exterior surface; and
the sensing surface of the or each sensing electrode portion is configured with a three dimensional profile to conform to the exterior surface of the first non-conductive material.

7. The device of claim 3, wherein the first non-conductive material is at least one of: formed of or comprises a thermo-formable material; formed by a moulding process.

8. The device of claim 4, wherein the second non-conductive material is at least one of: formed of or comprises a thermo-formable material; and formed by a moulding process.

9. The device of claim 3, wherein the first non-conductive material is at least one of: rigid; pliable; and deformable.

10. The device of claim 4, wherein the second non-conductive material is at least one of: rigid; pliable; and deformable.

11. The device of claim 1, wherein:
the or each electrical connector comprises a rigid mating portion configured to deform or penetrate the contacting surface of the or each touch sensing electrode portion; or
the or each electrical connector comprises a rigid mating portion configured to deform or penetrate the contacting surface of the or each touch sensing electrode portion, and wherein the mating portion is biased towards the contacting surface of the or each touch sensing electrode portion.

12. The device of claim 1 comprising at least one of:
(i) a plurality of touch sensing electrode portions spatially distributed around the handle portion, wherein each touch sensing electrode portion is configured to provide an electrical signal in response to touch by an operator, such as touch by different portions of a digit or different digits;
(ii) wherein the or each electrical signal is provided in response to a change in capacitance between the respective touch sensing electrode portion and the operator's finger/hand;
(iii) further comprising a hand mounting portion connected or connectable to the handle portion and configured to mount the handle portion to said operator's finger/hand;
(iv) further comprising a switching mechanism configured to provide a control signal to the measurement module to switch the measurement module between a left hand mode and a right hand mode; and
(v) further comprising a switching mechanism configured to provide a control signal to the measurement module to switch the measurement module between a left hand mode and a right hand mode, and wherein the measurement module is configured to determine a position of a left hand finger based on the or each electrical signal and the control signal when in the left hand mode, and to determine a position of a right hand finger based on the or each electrical signal and the control signal when in the right hand mode;
(vi) further comprising a switching mechanism configured to provide a control signal to the measurement module to switch the measurement module between a left hand mode and a right hand mode, and wherein the measurement module is configured to determine a position of a left hand finger based on the or each electrical signal and the control signal when in the left hand mode, and to determine a position of a right hand finger based on the or each electrical signal and the control signal when in the right hand mode and, wherein the switching mechanism is at least one of: a switch, button or sensor disposed on or in the handle portion, and actuated upon connection of the hand mounting portion to the handle portion.

13. A method of manufacturing a sensor device, the method comprising:
forming a handle portion comprising:
forming a non-conductive core defining an internal cavity; and
forming a plurality of touch sensing electrode portions in or on an outer wall of the cavity such that each touch sensing electrode portion comprises an exposed contacting surface located on and accessible from the cavity side of the respective touch sensing electrode portion, wherein each touch sensing electrode portion is moulded from a thermo-formable non-metallic conductive material;

providing a measurement module with a plurality of electrical connectors, each electrical connector configured to mechanically contact one of the plurality of moulded touch sensing electrode portions directly and receive an electrical signal from the contacted moulded touch sensing electrode portion; and mounting the measurement module within the handle portion such that each of the plurality of electrical connectors mechanically contacts the respective contacting surface of the contacted moulded touch sensing electrode portion directly from the cavity side.

14. The method of claim 13, wherein the step of forming the handle portion comprises:

forming the one or more touch sensing electrode portion(s); and providing a first non-conductive material at least on or over the or each touch sensing electrode portion; and wherein at least one of:

the first non-conductive material is configured to provide at least one of a hand grip and finger grip;

the first non-conductive material has a three dimensionally profiled exterior surface; and the sensing surface of the or each sensing electrode portion is configured with a three dimensional profile to conform to the exterior surface of the first non-conductive material.

15. The method of claim 13, wherein the step of mounting the measurement module within the handle portion comprises: positioning the measurement module to a contacting position within the handle portion in which the one or more electrical connectors mechanically contact the respective contacting surfaces of the or each touch sensing electrode portion.

16. The method of claim 14, wherein at least one of:

the core is formed of or comprises a non-conductive material that is different from the first non-conductive material; and wherein the first non-conductive material is further provided on or over the exterior surface of the core.

17. The method of claim 14, wherein at least one of:

the core comprises the first non-conductive material, and the or each touch sensing electrode portion is formed in or on the interior surface of the first non-conductive material; and wherein the core is integrally formed with the first non-conductive material.

18. The method of claim 14, wherein the first non-conductive material is at least one of: formed of or comprises a thermo-formable material; and is formed by a moulding process.

19. The method of claim 16, wherein the non-conductive material of the core is at least one of: formed of or comprises a thermo-formable material; and is formed by a moulding process.

* * * * *